United States Patent [19]

Lee

[11] Patent Number: 5,710,991
[45] Date of Patent: Jan. 20, 1998

[54] APPARATUS AND METHOD FOR CONTROLLING AND MEASURING OUTPUT POWER OF TRANSMITTER

[75] Inventor: Chang-Yong Lee, Ahnyang, Rep. of Korea

[73] Assignee: SamSung Electronics Co., Ltd., Kyungki-do, Rep. of Korea

[21] Appl. No.: 454,722

[22] Filed: May 31, 1995

[30] Foreign Application Priority Data

May 31, 1994 [KR] Rep. of Korea ............... 12168/1994

[51] Int. Cl.$^6$ ............................................... H01Q 11/12
[52] U.S. Cl. ............................................ 455/126; 455/117
[58] Field of Search ............................... 455/126, 127, 455/115, 89, 343; 330/279, 129, 284

[56] References Cited

U.S. PATENT DOCUMENTS

| | | | |
|---|---|---|---|
| 4,485,349 | 11/1984 | Siegel | 330/3 |
| 4,709,403 | 11/1987 | Kikuchi | 455/126 |
| 4,803,440 | 2/1989 | Hotta et al. | 330/145 |
| 5,054,116 | 10/1991 | Davidson | 455/126 |
| 5,095,542 | 3/1992 | Suematsu | 455/127 |
| 5,124,665 | 6/1992 | McGann | 330/149 |
| 5,128,629 | 7/1992 | Trinh | 330/129 |
| 5,144,258 | 9/1992 | Nakanishi et al. | 330/129 |
| 5,193,223 | 3/1993 | Walczak et al. | 455/115 |
| 5,287,555 | 2/1994 | Wilson et al. | 455/115 |
| 5,504,457 | 4/1996 | Jensen | 330/129 |

*Primary Examiner*—Edward F. Urban
*Assistant Examiner*—Darnell R. Armstrong
*Attorney, Agent, or Firm*—Robert E. Bushnell, Esq.

[57] ABSTRACT

An apparatus for controlling the output power of a transmitter installed in a vehicle or used in a mobile radio communication equipment and more particularly to apparatus and method for accurately measuring and controlling over a wide range the output power of a radio frequency to be transmitted. The apparatus has a voltage level adjusting unit for amplifying a voltage of a radio frequency signal to be transmitted in correspondence with a difference between output power set data and measuring output power data to adjust a voltage level of the radio frequency signal to be transmitted; a power amplifying unit for amplifying an output signal delivered from the voltage level adjusting unit; a coupler for sensing a power level outputted from the power amplifying unit; an attenuator for controlling the power level sensed by the coupler in response to an attenuation ratio control signal applied; a high power level measuring unit for generating address data indicating that the radio frequency signal to be transmitted is in a high power level and generating the attenuation ratio control signal indicative of the amount of attenuation thereto, in the case that a maximum value of a power level outputted from the attenuator is larger than a set value; a radio frequency amplifying unit for amplifying the power outputted from the attenuator in response to an amplification ratio control signal.

36 Claims, 2 Drawing Sheets

APPARATUS AND METHOD FOR CONTROLLING AND MEASURING OUTPUT POWER OF TRANSMITTER

CROSS-REFERENCE TO RELATED APPLICATIONS

This application makes reference to, incorporates herein, and claims all benefits accruing under 35 C.F.R. §119 from an application for *Apparatus and Method for Controlling and Measuring Output Power of Transmitter* earlier filed in the Korean Industrial Property Office on 31 May 1994 and assigned Ser. No. 12168/1994.

BACKGROUND OF THE INVENTION

The present invention relates to an apparatus for controlling the output power of a transmitter installed in a vehicle or used in mobile radio communication equipment, and more particularly to apparatus and method for accurately measuring and controlling, over a wide range, the output power of a radio frequency signal to be transmitted.

Generally, it is known in the art that mobile communication systems use code division multiple access spread spectrum communication signals. In these mobile communication systems, a transmitter is installed in a vehicle or used at a single cell-site. Contemporary systems are, I have discovered, are not able to reliably provide mobile communication over a wide range.

In contemporary current practice, an apparatus for controlling the output power of a transmitter includes a power amplifier, a coupler, a radio frequency variable attenuator, a radio frequency amplifier, a detector, a direct current amplifier, a reference voltage unit, a comparator and a voltage control circuit. In U.S. Pat. No. 4,709,403 issued to Jiro Kikuchi, Japan, and entitled *APPARATUS FOR CONTROLLING OUTPUT POWER OF TRANSMITTER*, a radio frequency signal to be transmitted is provided to a power amplifier from an input terminal and is amplified in correspondence with a control signal of the voltage control circuit. The coupler is disposed after the power amplifier to deliver an output corresponding to the amplified output power. The radio frequency variable attenuator variably attenuates the output of the coupler in response to the output power of the transmitter as detected by a detector. The attenuation by the variable attenuator has a function of causing an output voltage of the detector to be compressed. The compressed voltage from the detector equivalently increases the dynamic range of the comparator.

A radio frequency amplifier is disposed between the radio frequency variable attenuator and the detector. The detector detects an output of the radio frequency amplifier and provides a direct voltage corresponding to the detected output as an output signal. The direct voltage is applied as one input of a comparator and as an input to the direct current amplifier. The direct current amplifier amplifies the direct voltage in a previously set amplification ratio and then applies the amplified direct voltage to the radio frequency variable attenuator which attenuates the output of the coupler in correspondence with the amplified direct voltage. The reference voltage unit receives a voltage and provides a constant reference voltage to the other input of the comparator which, in turn, compares the output of the detector and an output of the reference voltage unit in order to provide a difference signal to the voltage control circuit. The voltage control circuit controls the power supply to the power amplifier. Accordingly, the variable attenuator functions to compress the dynamic range of the difference signal generated by the comparator.

The output voltage from a detector in the apparatus for controlling the output power of the transmitter has a nonlinearity characteristic that is a function of the amount of attenuation of the variable attenuator; however, for ease of control, I have observed that the output power of the transmitter should have a linearity characteristic that is a function of the output voltage of the detector.

There is a problem however, that a control error attributable to the nonlinear characteristic of the output voltage from the detector may occur because the control of output power in the apparatus is performed by analog methods. The control error is substantial when a transmitter output has a large dynamic range over a wide band. In addition, such apparatus has a resolution over several tens of decibels, and is therefore not amenable to control power under one decibel. Furthermore, the apparatus has difficulty in accurately controlling the output power of the transmitter after a level of the output power is measured, because no function for correcting the measured data exists.

The *POWER CONTROL CIRCUITRY FOR A TDMA RADIO FREQUENCY TRANSMITTER*, disclosed by Thomas J. Walczak, et al, in U.S. Pat. No. 5,193,223, discusses an apparatus plagued by the problem of substantial degradation due to the poor linearity of a variable attenuator. Walczak et al. provide a long time constant detector for detecting an average magnitude of the transmitter output signal. A controller samples the output of the detector and subtracts the sampled value from a desired value for a selected power level input to the controller from a microcomputer. The difference value is scaled by a pre-selected factor and the scaled difference value is added to a stored value to produce a new value. The new value is stored in memory to be output at the beginning of a next time slot for controlling gain of an intermediate frequency signal. In an attempt to overcome the problem regarding poor linearity of a variable attenuator, Walczak et al. remove the variable attenuator thus eliminating the benefit of the increased dynamic range of the comparison circuit and the benefit of the compressed dynamic range of the comparator output signal.

Separately from the problem of linearity, I have found that to enable more reliable radio communication, output power of the transmitter must be controlled over a wide range.

SUMMARY OF THE INVENTION

It is therefore an object of the present invention to provide an improved apparatus and method for controlling output power of a signal generated by a transmitter.

It is another object to provide an apparatus and method for controlling the output power of a transmitter, being free of the poor linearity problem of the variable attenuator while maintaining a compressed dynamic range of a signal used to control the voltage of a power amplifier.

It is still another object to provide an apparatus and method for maintaining a linearity characteristic of a transmitter output in a case where the dynamic range of the transmitter output is greatly enlarge over a wide band, thereby reducing a control error.

It is yet another object to provide an apparatus and method for controlling and measuring the output power of a transmitter, thereby having a more improved resolution for controlling of the output power of the transmitter, when compared to a conventional art.

It is a further object to provide an apparatus and method for minimizing a control error in the output power of a transmitter as well as accurately measuring the output power of the transmitter.

It is a yet further object to provide a communication system and process able to accurately control output power of a transmitter over a wider range.

It is a still further object to provide a more reliable mobile communication system.

These and other objects may be attained with an apparatus and method for controlling and measuring the output power of a transmitter according to the present invention. The apparatus includes a voltage level adjusting unit which amplifies a voltage of a radio frequency signal to be transmitted in correspondence with a difference between output power set data and measurement output power data to adjust a voltage level of the radio frequency signal to be transmitted; a power amplifier which amplifies an output signal delivered from the voltage level adjusting unit; a coupler which senses a power level output from the power amplifier; an attenuator which controls the power level sensed by the coupler in response to an attenuation ratio control signal applied thereto; a high power level measuring unit which generates address data indicating that the radio frequency signal to be transmitted is in a high power level and generates the attenuation ratio control signal indicative of the amount of attenuation thereto, in the case that a maximum value of the power level outputted from the attenuator is larger than a set value; a radio frequency amplifier which amplifies the power outputted from the attenuator in response to an amplification ratio control signal; a low power level measuring unit which generates address data indicating that the radio frequency signal to be transmitted is in a low power level and generates the amplification ratio control signal indicative of the amount of amplification thereto, when the value of the power level from the attenuator is smaller than a set value, by comparing a maximum value of a power level from the radio frequency amplifier with a set value; and a memory unit which stores correction data for the high and low power levels in a previously set storage region and provides the correction data as the measurement output power data in response to the address data.

The method is contemplates comparing output power set data with measurement output power data and amplifying a voltage of a radio frequency signal to be transmitted in correspondence with the difference therebetween to thereby adjust a voltage level of the radio frequency signal to be transmitted; amplifying the power of the voltage-amplified signal; sensing a level of the power-amplified signal; controlling a power level of the sensed signal in response to an attenuation ratio control signal applied thereto; generating address data indicating that the radio frequency signal to be transmitted is in a high power level and generating the attenuation ratio control signal indicative of the amount of attenuation to be applied, in the case that a maximum value of a power level of the sensed signal is larger than a set value; amplifying the power of the sensed signal in response to an amplification ratio control signal; generating address data indicating that the radio frequency signal to be transmitted is in a low power level and generating the amplification ratio control signal indicative of the amount of amplification to be applied, when a maximum value of the amplified power level is smaller than a set value, by comparing the maximum value of the amplified power level with a set value; and storing correction data for the high and low power levels in a previous set storage region to thus output the correction data as the measurement output power data in response to the address data.

The voltage level adjusting unit may be constructed with a comparator for digitally comparing the output power set data with the measurement output power data and generating a difference signal, a counter for counting the resulting difference signal of the comparator, a converter for converting the output data of the counter into an analog signal, and a voltage control amplifier for amplifying a voltage of the radio frequency signal to be transmitted in response to the analog signal. A coupler detects the power level of the transmitted radio frequency signal and provides the detected power level to a variable attenuator. The variable attenuator attenuates the power level according to a determined attenuation ratio control signal. The output from the variable attenuator is provided to a radio frequency amplifier and a high power level measuring unit. The high power level measuring unit may have a peak holding unit for holding a maximum value of a power level from the attenuator, a comparator for analogically comparing the maximum value of power level provided from the peak holding unit with a set value applied as a direct voltage and generating a difference signal, a counter for providing address data by counting the difference signal produced by the comparator, and a converter for converting the address data from the counter into an analog voltage so as to generate the attenuation ratio control signal. In the meantime, the radio frequency amplifier provides an amplification to the input attenuated power level in response to an amplification ratio control signal. A low power level measuring unit may have a peak holding unit for holding a maximum value of a power level outputted from the radio frequency amplifier, a comparator for analogically comparing a maximum value of power level provided from the peak holding unit with a set value applied as a direct voltage to produce a difference signal, a counter providing address data by counting the difference signal produced by the comparator, and a converter for converting the address data from the counter into an analog voltage to generate the amplification ratio control signal. The address data from the high or low power level measuring units is provided to a read only memory (ROM) having a table stored therein providing measurement output power data in response to the address data.

Measurement of a transmitting power under the above mentioned construction is performed by dividing the transmitting power into high and low power levels, so that a control error for the transmitting power can be reduced. Even though the dynamic range of the transmission signal is large in a wide band, the linearity of the output of the transmitter can be maintained. Also, resolution for control of the output power of the transmitter can be improved by a digital measurement manner when compared apparatus constructed according to contemporary circuit practice, and the output power of the transmitter can be exactly measured and controlled.

BRIEF DESCRIPTION OF THE DRAWINGS

A more thorough appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT(S)

In the following description, numerous specific details are set forth in order to provide a thorough understanding of the present invention. It will be understood by those skilled in the art that other embodiments of the present invention may be practiced without these specific details, or with alternative specific details.

Figure 1:
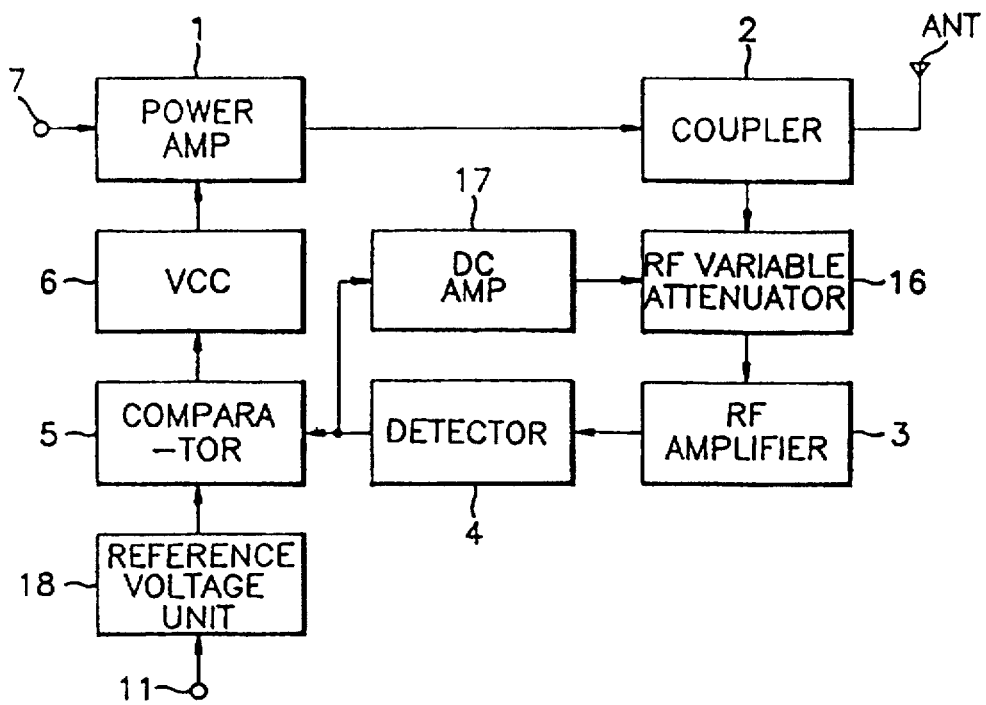
FIG. 1 is a block diagram illustrating a configuration of an earlier apparatus for controlling the output power of a transmitter.

Tuning now to the drawings, FIG. 1 is a block diagram illustrating a configuration of an apparatus for controlling the output power of a transmitter such as is found in U.S. Pat. No. 4,709,403 issued to Jiro Kikuchi, Japan, and entitled *APPARATUS FOR CONTROLLING OUTPUT POWER OF TRANSMITTER*. In FIG. 1, the apparatus for controlling the output power of transmitter includes a power amplifier 1, a coupler 2, a radio frequency variable attenuator 16, a radio frequency amplifier 3, a detector 4, a direct current amplifier 17, a reference voltage unit 18, a comparator 5 and a voltage control circuit VCC 6. A radio frequency signal to be transmitted from an input terminal 7 is amplified by power amplifier 1 in correspondence with a control signal of the voltage control circuit 6. The coupler 2 disposed after the power amplifier 1 delivers an output corresponding to the amplified output power. The radio frequency variable attenuator 16 variably attenuates the output of the coupler 2 in response to an output of detector 4. The attenuation by variable attenuator 16 has a function of causing an output voltage of detector 4 to be compressed. The compressed voltage from detector 4 equivalently increases the dynamic range of the comparator 5. The radio frequency amplifier 3 is disposed between the radio frequency variable attenuator 16 and detector 4. The detector 4 detects an output of the radio frequency amplifier 3 and outputs a direct voltage corresponding to the detected output. The direct voltage is applied to one input of comparator 5 and is applied as an input to direct current amplifier 17. The direct current amplifier 17 amplifies the direct voltage according to a previously set amplification ratio and then applies the amplified direct voltage to radio frequency variable attenuator 16. Accordingly, attenuator 16 attenuates the output of coupler 2 in correspondence with the amplified direct voltage.

Figure 2:
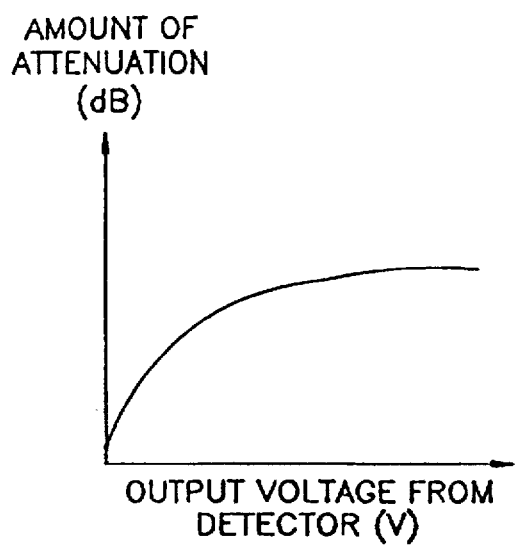
FIG. 2 is a graph illustrating the amount of attenuation introduced by the attenuator against the output voltage from the detector of FIG. 1.
Figure 3:
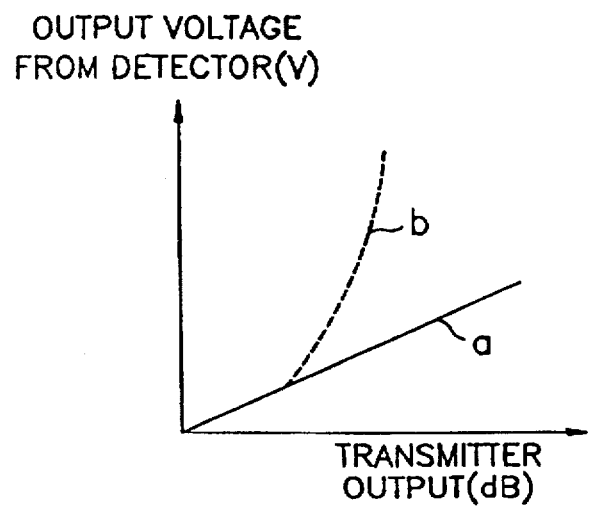
FIG. 3 is a graph illustrating the output voltage from the detector against the output of the transmitter of FIG. 1.

The reference voltage unit 18 receives a voltage applied from a node 11 and provides a constant reference voltage to the other input of the comparator 5. Comparator 5 compares the output of the detector 4 and an output of the reference voltage unit 18 and provides a difference signal to the voltage control circuit 6 which controls the power supply to the power amplifier 1. Accordingly, the variable attenuator 16 functions to compress the dynamic range of the difference signal output by the comparator 5. The output voltage from the detector in the apparatus for controlling the output power of the transmitter in FIG. 1 has a non-linearity characteristic as a function of the amount of attenuation of the variable attenuator. FIG. 2 is a graph showing the non-linearity characteristic of the output voltage from the detector. For the ease of control, the output power of the transmitter should have a linearity characteristic that is a function of the output voltage of the detector. Accordingly, in the apparatus of FIG. 1, the detector 4 is designed to have an output characteristic indicated by a dotted line 'b' of FIG. 3 relative to the output power of the transmitter. The composition of the graph of FIG. 2 and the dotted line 'b' of FIG. 3 produces a graph indicated by a solid line 'a' of FIG. 3.

There is a problem however, because a control error caused due to the non-linearity of the characteristic of the output voltage from the detector may occur due to the control of output power in the apparatus of FIG. 1 if the control is performed by analog methods. The control error occurs particularly when a transmitter generates an output signal having a large dynamic range over a wide band. In addition, apparatus of the type represented by FIG. 1 has a resolution over several tens of decibels, and thus can not conveniently control the power under one decibel. Furthermore, the apparatus has difficulty in accurately controlling the output power of the transmitter after a level of the output power is measured, since no function for correcting the measured data exists.

Figure 4:
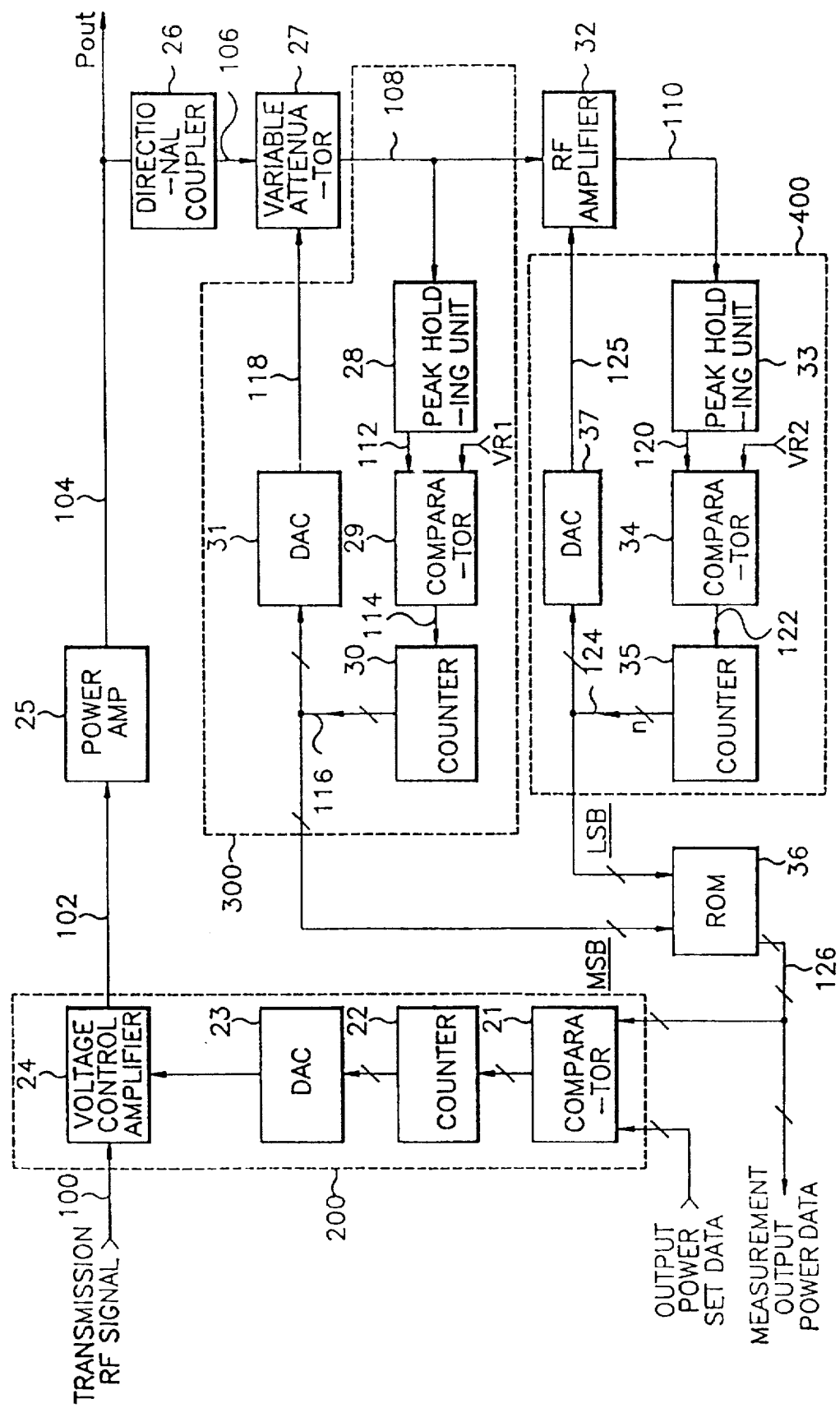
FIG. 4 is a block diagram illustrating an apparatus for controlling and measuring the output power of the transmitter according to the present invention.

FIG. 4 is a block diagram illustrating an apparatus for controlling and measuring the output power of the transmitter according to the principles of present invention. This apparatus includes a voltage level adjusting unit 200, a power amplifier 25, a directional coupler 26, a variable attenuator 27, a high power level measurement unit 300, a radio frequency (RF) amplifier 32, a low power level measuring unit 400 and a read only memory (ROM) 36.

The voltage level adjusting unit 200 amplifies a voltage of a radio frequency signal to be transmitted in correspondence with a difference between output power set data and measurement output power data to adjust a voltage level of the radio frequency signal to be transmitted. The voltage level adjusting unit 200 comprises a comparator 21 for digitally comparing the output power set data (discussed later) with the measurement output power data (discussed later) and producing a difference signal as a result of the comparison, a counter 22 for counting up or down according to the difference signal output by the comparator 21, a converter 23 for converting the output data of the counter 22 into an analog signal, and a voltage control amplifier 24 for amplifying a voltage of the radio frequency signal to be transmitted in response to the analog signal.

The power amplifier 25 receives the output signal delivered from the voltage level adjusting unit 200 through a line 102 and amplifies the received output signal. The directional coupler 26 is connected to the power amplifier 25 through a line 104 to sense a level of the output power Pout from the power amplifier 25. Here, the output of the directional coupler 26 may be a voltage corresponding to intensity of the output power $P_{out}$ to be transmitted. The variable attenuator 27 is displaced at a rear stage of the directional coupler 26 through a line 106. The variable attenuator 27 attenuates the input signal thereof in response to an attenuation ratio control signal applied through a line 118.

The high power level measuring unit 300 generates address data indicating that the radio frequency to be transmitted has a high power level and generates an attenuation ratio control signal indicative of the amount of attenuation to be performed by variable attenuator 27, when a maximum value of the power level outputted from the variable attenuator 27 is larger than a set value VR1. The high power level measuring unit 300 includes a peak holding unit 28 for holding a maximum value of a power level outputted from the variable attenuator 27, a comparator 29 for analogically comparing a direct voltage to the maximum value of power level provided from the peak holding unit 28 with the set value VR1 applied as a direct voltage, a counter 30 providing the address data by receiving and counting through a line 114 a comparison result, i.e., difference signal, produced by the comparison of the comparator 29, and a converter 31 for receiving the address data of the counter 30 and converting the address data into an analog voltage to generate the attenuation ratio control signal. The converter 31 may be comprised of a digital-to-analog converter.

The radio frequency amplifier 32 is connected to the line 108 and amplifies the output of the variable attenuator 27 in response to an amplification ratio control signal applied through a line 125.

The low power level measuring unit 400 generates address data indicating that the radio frequency to be transmitted has a low power level and generates an amplification ratio control signal indicative of the amount of amplification to be performed by the radio frequency amplifier 32 (when a maximum value of the power level outputted from the variable attenuator is smaller than the set value VR1) by comparing a maximum value of the amplified output power level from the radio frequency amplifier 32 with a set value VR2. Here, the low power level measuring unit 400 is comprised of a peak holding unit 33 for holding a maximum value of a power level outputted from the radio frequency amplifier 32, a comparator 34 for analogically comparing a direct voltage, i.e., VR2, to the maximum value of power level provided through a line 120 from the peak holding unit 33, a counter 35 for outputting address data by receiving and counting through a line 122 a comparison result, i.e., difference signal, produced by the comparison of the comparator 34, and a converter 37 for receiving through a line 124 the address data from counter 35 and converting the address data into an analog voltage to generate the amplification ratio control signal. The converter 37 may be comprised of a digital-to-analog converter.

ROM 36 stores correction data for the high and low power levels in a previously set storage region, i.e., in a table, and outputs through a line 126 the correction data as the measurement output power data in response to the address data. In this case, the measurement output power data is applied as one input to comparator 21, and is also input to a control unit (not shown) of a system to be displayed numerically on a display element. Thereby, a user can recognize the intensity of the output power of the signal being currently transmitted.

An explanation of operation of the apparatus for controlling and measuring the output power of a transmitter will be given with reference to FIG. 4. In this figure, for accurately controlling in a wide band the power of the radio frequency signal to be transmitted through a line 100, the output power set data is provided at one input of the comparator 21. The output power set data is a digital value output from a control unit (not shown) indicative of a desired power level. Accordingly, comparator 21 compares the output power set data and the measurement output power data applied through line 126. The output of the comparator 21 is digital data indicative of a difference between the above-described data obtained by the comparison of each bit unit. Counter 22 starts to count, up or down, the output data of the comparator 21. At this time, an up-counting operation is performed when a value of the measurement output power data is smaller than that of the output power set data, and to the contrary, a down-counting operation is performed when the value of the measurement output power data is larger than that of the output power set data. Converter 23 produces an analog voltage corresponding to the up or down-counting operation and adjusts a gain of the voltage control amplifier 24. Hence, the radio frequency signal to be transmitted to the line 102 is adjusted in a direction converging toward the desired output power as indicated by the output power set data.

Power amplifier 25 receives the output signal of the line 102 and amplifies the output signal according to a preset ratio. Power amplifier 25 provides an amplified output signal through the line 104 as the output power $P_{out}$ transmitted through a transmission path. In the meantime, directional coupler 26, connected to the line 104, detects the intensity of the power of the output signal, and outputs a voltage corresponding to the detected intensity. In this case, the directional coupler 26 does not detect the peak of the output power of the output signal, but serves as a coupling component of the output signal. Upon an initial operation, the variable attenuator 27 passes through the output voltage of the directional coupler 26 without any attenuation, but after the initial operation, attenuates the output voltage of the directional coupler 26 in response to the attenuation ratio control signal. The output of the variable attenuator 27 is applied through the line 108 to peak holding unit 28 within the high power level measuring unit 300 and to the radio frequency amplifier 32. Where the power level of the output signal of the variable attenuator 27 is high, components within the high power level measuring unit 300 are activated. To the contrary, where the power level of the output signal of the variable attenuator 27 is low, components within the low power level measuring unit 400 are activated. A standard of the high or low power level becomes the set value VR1 (VR2 may have the same value as VR1) which is arranged for the improvement of the resolution in a wide band in the preferred embodiment of the present invention.

In the high power level measuring unit 300, when a holding value of a maximum value of the signal on the line 108 is larger than the set value VR1, counter 30 performs an up-counting operation. The counted data is expressed as the address data through a line 116. Converter 31 provides a voltage corresponding to the address data as an output signal to the line 118. The voltage on the line 118 becomes the attenuation ratio control signal. Where an attenuation ratio of the attenuation ratio control signal is high, the variable attenuator 27 attenuates to a greater extent the signal on the line 106, but where the attenuation ratio is low, the variable attenuator 27 attenuates to a lesser extent the signal on the line 106.

The low power level measuring unit 400 operates during the initial operation of the system, but after this, has no effect on the control and measurement of a high power level. The address data produced in the high power level measuring unit 300 is applied as input address data for the most significant bit (MSB) address inputs of ROM 36. The address data produced in the low power level measuring unit 400 is applied as input address data for the least significant bit (LSB) address inputs of ROM 36, which data is regarded as invalid according a table set in the ROM 36 during control and measurement of a high power level.

In the meantime, the operation of the low power level measuring unit 400 is activated when that the amount of attenuation introduced by the variable attenuator 27 is a minimum value by the operation of each component in the high power level measuring unit 300. In other words, each component of the high power level measuring unit 300 forms a feedback loop, thereby enabling a value of the attenuation ratio control signal to be a minimum value. In this state, the comparator 34 within the low power level measuring unit 400 compares a voltage on the line 120 with the set value VR2. Here, the comparator 34 produces a positive output in the case that the voltage on the line 120 is smaller than the set value VR2. Accordingly, counter 35 starts to perform an up-counting operation. The counted data of counter 35 becomes the address data and exists on the line 124. The converter 37 applies an analog voltage corresponding to the counted data to the line 125 as the amplification ratio control signal. As a result, the low power level measuring unit 400 maintains the feedback loop until it reaches the set value VR2. Upon the measurement of the low power level, the address data from the high power level measuring unit 300 provided to the ROM 36 is invalid and only the address data from the low power level measuring unit 400 is valid.

ROM 36 is a non-volatile semiconductor memory and has a storage region where correction data corresponding to the address data is previously stored in a table. The correction data is set by considering a coupling factor of the directional coupler 26 and a correlation relation of the attenuation ratio control signal and the amplification ratio control signal. Hence, the correction data output from the ROM 36 becomes the measurement output power data, which is applied to a control unit (not shown) which digitally displays the data on a display element. Moreover, the measurement output power data is applied to one input of comparator 21 and is compared with the output power set data.

As earlier mentioned, measurement of a transmitting power under the above mentioned construction according to the present invention is made by dividing the transmitting power into high and low power levels, so that a control error for the transmitting power can be reduced. Therefore, even though the dynamic range of the transmission output is large in a wide band, the linearity of the output of the transmitter can be maintained. Also, resolution for control of the output power of the transmitter can be improved by a digital measurement manner when compared to the device of FIG. 1, and the output power of the transmitter can be exactly measured and controlled.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For example, process of up and down counting operations of the counters may be performed reversely, if necessary. Also, the condition of operation of the comparator may be modified, and instead of a ROM, a software program may be used.

What is claimed is:

1. An apparatus for controlling the output power of a transmitter by amplifying a voltage of a radio frequency signal to be transmitted, said apparatus comprising:

means for outputting a voltage level signal by sensing an output power level of a transmitted radio frequency signal, said voltage level being indicative of said output power level;

means for generating an attenuated signal by attenuating said voltage level signal in response to an attenuation ratio control signal;

means for generating first address data by determining that said attenuated signal is larger than a first voltage reference;

means for converting said first address data into said attenuation ratio control signal;

memory means having correction data stored in a table for outputting said correction data as measurement output power data in response to said first address data; and means for adjusting a voltage level of said radio frequency signal in response to a difference between said measurement output power data and output set power data indicative of a desired power level, an output of said means for adjusting a voltage level being provided to said means for outputting a voltage level signal.

2. The apparatus as set forth in claim 1, further comprising:

means for amplifying said attenuated signal in response to an amplification ratio control signal;

means for generating second address data by determining that an output signal from said means for amplifying is smaller than a second voltage reference;

means for converting said second address data into said amplification ratio control signal;

said memory means having said correction data stored in said table outputting said correction data as said measurement output power data in response to one of said first address data and said second address data.

3. The apparatus as set forth in claim 1, further comprising:

a power amplifier coupled to the output of said means for adjusting a voltage level of said radio frequency signal for generating said transmitted radio frequency signal; and said means for outputting a voltage level signal comprising a directional coupler coupled to an output of said power amplifier.

4. The apparatus as set forth in claim 1, said means for generating an attenuated signal comprising a variable attenuator.

5. The apparatus as set forth in claim 1, said means for generating a first address signal comprising:

peak holding means for holding a maximum power level of said attenuated signal;

comparator means for comparing said maximum power level to said first voltage reference; and a counter for generating said first address data in response to an output of said comparator means.

6. The apparatus as set forth in claim 1, said means for converting comprising a digital-to-analog converter.

7. The apparatus as set for in claim 1, said memory means comprising a non-volatile memory.

8. The apparatus as set forth in claim 1, said memory means comprising a read only memory.

9. The apparatus as set forth in claim 7, said non-volatile memory comprising a read only memory.

10. The apparatus as set forth in claim 1, said means for adjusting a voltage level of said radio frequency signal comprising:

a comparator for determining the difference between said measurement output power data and output set power data;

an up/down counter responsive to an output of said comparator;

a digital-to-analog converter for converting an output of said up/down counter into an analog signal; and a voltage controlled amplifier for amplifying said radio frequency signal in response to said analog signal.

11. The apparatus as set forth in claim 2, said means for generating a second address signal comprising:

peak holding means for holding a maximum power level of said output signal from said means for amplifying said attenuated signal;

comparator means for comparing said maximum power level to said second voltage reference; and a counter for generating said second address data in response to an output of said comparator means.

12. The apparatus as set forth in claim 2, said memory means comprising a non-volatile memory having most significant bit address inputs connected to receive said first address data and least significant bit address inputs connected to receive said second address data, said non-volatile memory outputting said correction data as said measurement output power data in response to said first address data when said output power level of said transmitted radio frequency signal has a high power level, said non-volatile memory outputting said correction data as said measurement output power data in response to said second address data when said output power level of said transmitted radio frequency signal has a low power level.

13. An apparatus for controlling output power of a transmitter having a power amplifier for generating a transmitted radio frequency signal, said apparatus comprising:

sensing means coupled to said power amplifier for sensing said output power of said transmitter, said sensing means outputting a voltage level signal indicative of the sensed output power;

a variable attenuator for generating an attenuated signal by attenuating said voltage level signal in response to an attenuation ratio control signal;

a radio frequency amplifier for generating an amplified signal by amplifying said attenuated signal in response to an amplification ratio control signal;

high power level measuring means responsive to said attenuated signal for generating first address data when said attenuated signal has a high power level;

low power level measuring means responsive to said amplified signal for generating second address data when said amplified signal has a low power level;

read only memory means having a table of correction data stored therein, said read only memory means outputting said correction data as measured output power data in response to one of said first address data and said second address data;

voltage level adjusting means coupled to receive output power set data indicative of a desired output power level and said measured output power data, said voltage level adjusting means amplifying a voltage level of a radio frequency signal to be transmitted in response to a difference between said output power set data and said measured output power data.

14. The apparatus as set forth in claim 13, wherein said sensing means comprises a directional coupler.

15. The apparatus as set forth in claim 13, wherein said high power level measuring means generates said attenuation ratio control signal by converting said first address data into a first analog signal; and said low power level measuring means generates said amplification ratio control signal by converting said second address data into a second analog signal.

16. The apparatus as set forth in claim 13, wherein said high power level measuring means comprises:

peak holding means for holding a maximum power level of said attenuated signal;

a comparator for comparing said maximum power level of said attenuated signal held by said peak holding means to a direct voltage, said comparator outputting a comparison signal when said maximum power level is greater than said direct voltage;

a counter responsive to said comparison signal for generating said first address data; and a converter for converting said first address data into an analog signal, said analog signal forming said attenuation ratio control signal.

17. The apparatus as set forth in claim 13, wherein said low power level measuring means comprises:

peak holding means for holding a maximum power level of said amplified signal;

a comparator for comparing said maximum power level of said amplified signal held by said peak holding means to a direct voltage, said comparator outputting a comparison signal when said maximum power level is less than said direct voltage;

a counter responsive to said comparison signal for generating said second address data; and a converter for converting said second address data into an analog signal, said analog signal forming said amplification ratio control signal.

18. The apparatus as set forth in claim 16, wherein said low power level measuring means comprises:

second peak holding means for holding a maximum power level of said amplified signal;

a second comparator for comparing said maximum power level of said amplified signal held by said second peak holding means to a second direct voltage, said second comparator outputting a second comparison signal when said maximum power level of said amplified signal is less than said second direct voltage;

a second counter responsive to said second comparison signal for generating said second address data; and a second converter for converting said second address data into a second analog signal, said second analog signal forming said amplification ratio control signal.

19. The apparatus as set forth in claim 13, wherein said voltage level adjusting means comprises:

a comparator for outputting a difference signal in response to a difference between said output power set data and said measured output power data;

a counter for counting up or down in response to said difference signal;

a converter for converting an output of said counter to an analog control signal; and a voltage controlled amplifier for adjusting the voltage of said radio frequency signal to be transmitted in response to said analog control signal.

20. The apparatus as set forth in claim 19, wherein said high power level measuring means comprises:

peak holding means for holding a maximum power level of said attenuated signal;

a second comparator for comparing said maximum power level of said attenuated signal held by said peak holding means to a direct voltage, said second comparator outputting a comparison signal when said maximum power level is greater than said direct voltage;

a second counter responsive to said comparison signal for generating said first address data; and a second converter for converting said first address data into an analog signal, said analog signal forming said attenuation ratio control signal.

21. The apparatus as set forth in claim 20, wherein said low power level measuring means comprises:

second peak holding means for holding a maximum power level of said amplified signal;

a third comparator for comparing said maximum power level of said amplified signal held by said second peak holding means to a second direct voltage, said third comparator outputting a second comparison signal when said maximum power level of said amplified signal is less than said second direct voltage;

a third counter responsive to said second comparison signal for generating said second address data; and a third converter for converting said second address data into a second analog signal, said second analog signal forming said amplification ratio control signal.

22. The apparatus as set forth in claim 21, wherein said first direct voltage is greater than said second direct voltage.

23. The apparatus as set forth in claim 21, wherein said first direct voltage is equal to said second direct voltage.

24. An apparatus for controlling the output power of a transmitter, said apparatus comprising:

high power level measuring means for generating first address data indicating that said output power of said transmitter has a high power level;

low power level measuring means for generating second address data indicating that said output power of said transmitter has a low power level;

non-volatile memory means having a table of correction data stored therein, said non-volatile memory means outputting said correction data as measured output power data in response to one of said first address data and said second address data;

voltage level adjusting means coupled to receive output power set data indicative of a desired output power level and said measured output power data, said voltage level adjusting means amplifying a voltage level of a radio frequency signal to be transmitted in response to a difference between said output power set data and said measured output power data.

25. The apparatus as set forth in claim 24, said non-volatile memory means comprising a read only memory.

26. The apparatus as set forth in claim 24, wherein said non-volatile memory means comprises a read only memory having most significant bit address inputs connected to receive said first address data and least significant bit address inputs connected to receive said second address data, said read only memory outputting said correction data as said measurement output power data in response to said first address data when said output power of said transmitter has a high power level, said read only memory outputting said correction data as said measurement output power data in response to said second address data when said output power of said transmitter has a low power level.

27. A method for controlling the output power of a transmitter, said method comprising the steps of:

generating first address data indicating that said output power of said transmitter has a high power level;

generating second address data indicating that said output power of said transmitter has a low power level;

outputting correction data from a read only memory as measured output power data in response to one of said first address data and said second address data;

inputting output power set data indicative of a desired output power level; and amplifying a voltage level of a radio frequency signal to be transmitted in response to a difference between said measured output power data and said output power set data.

28. The method as set forth in claim 27, further comprising the steps of:

sensing said output power of said transmitter and outputting a voltage level signal indicative of the sensed output power;

generating an attenuated signal by attenuating said voltage level signal in response to an attenuation ratio control signal;

generating an amplified signal by amplifying said attenuated signal in response to an amplification ratio control signal;

generating said first address data in response to said attenuated signal when said attenuated signal has a high power level; and generating said second address data in response to said amplified signal when said amplified signal has a low power level.

29. The method as set forth in claim 28, further comprising the steps of:

converting said first address data into said attenuation ratio control signal; and converting said second address data into said amplification ratio control signal.

30. The method as set forth in claim 27, said step of generating first address data comprising the steps of:

sensing said output power of said transmitter and outputting a voltage level signal indicative of the sensed output power;

generating an attenuated signal by attenuating said voltage level signal in response to an attenuation ratio control signal;

comparing a maximum power level of said attenuated signal to a reference voltage; and generating a count in response to a result of said comparing step, said count forming said first address data.

31. The method as set forth in claim 27, said step of generating second address data comprising the steps of:

sensing said output power of said transmitter and outputting a voltage level signal indicative of the sensed output power;

generating an attenuated signal by attenuating said voltage level signal in response to an attenuation ratio control signal;

generating an amplified signal by amplifying said attenuated signal in response to an amplification ratio control signal;

comparing a maximum power level of said amplified signal to a reference voltage; and generating a count in response to a result of said comparing step, said count forming said second address data.

32. The method as set forth in claim 30, said step of generating second address data comprising the steps of:

generating an amplified signal by amplifying said attenuated signal in response to an amplification ratio control signal;

comparing a maximum power level of said amplified signal to a second reference voltage; and generating a second count in response to a result of said comparing step of comparing a maximum power level of said amplified signal to a second reference voltage, said second count forming said second address data.

33. The method as set forth in claim 27, said amplifying step comprising the steps of:

comparing said measured output power data and said output power set data to generate a difference signal;

counting in one of an up direction or a down direction in response to said difference signal for generating a count;

converting said count to an analog control signal; and amplifying said voltage level of said radio frequency signal to be transmitted in response to said analog control signal.

34. A method for controlling the output power of a transmitter, said method comprising the steps of:

sensing said output power of said transmitter and outputting a voltage level signal indicative of the sensed output power;

generating an attenuated signal by attenuating said voltage level signal in response to an attenuation ratio control signal;

comparing a maximum power level of said attenuated signal to a reference voltage;

generating first address data in response to a result of said comparing step;

outputting correction data from a read only memory as measured output power data in response to said first address data;

inputting output power set data indicative of a desired output power level; and amplifying a voltage level of a radio frequency signal to be transmitted in response to a difference between said measured output power data and said output power set data.

35. The method as set forth in claim 34, further comprising the steps of:

generating an amplified signal by amplifying said attenuated signal in response to an amplification ratio control signal;

comparing a maximum power level of said amplified signal to a second reference voltage; and generating second address data in response to a result of said step of comparing a maximum power level of said amplified signal to a second reference voltage; and outputting said correction data from said read only memory as said measured output power data in response to one of said first address data and said second address data.

36. The method as set forth in claim 35, further comprising the steps of:

converting said first address data into said attenuation ratio control signal; and converting said second address data into said amplification ratio control signal.

* * * * *